United States Patent [19]
Okabe et al.

[11] Patent Number: 6,105,243
[45] Date of Patent: Aug. 22, 2000

[54] METHOD OF FABRICATING MULTILAYER PRINTED CIRCUIT BOARD

[75] Inventors: Shuhichi Okabe; Keizo Sakurai, both of Shiga-ken, Japan

[73] Assignee: International Business Machines, Corp., Armonk, N.Y.

[21] Appl. No.: 09/266,658

[22] Filed: Mar. 11, 1999

Related U.S. Application Data

[62] Division of application No. 08/761,027, Dec. 5, 1996.

[51] Int. Cl.$^7$ ...................................................... H05K 3/36
[52] U.S. Cl. .................................. 29/830; 29/829; 29/843
[58] Field of Search ............................. 29/830, 852, 846, 29/829, 843; 427/96, 97

[56] References Cited

U.S. PATENT DOCUMENTS

| | | |
|---|---|---|
| 4,629,681 | 12/1986 | Takada et al. . |
| 5,426,849 | 6/1995 | Kimbara et al. . |
| 5,451,721 | 9/1995 | Tsukada et al. . |
| 5,589,250 | 12/1996 | Asai et al. . |
| 5,628,852 | 5/1997 | Ishida . |

FOREIGN PATENT DOCUMENTS

| | | | |
|---|---|---|---|
| 2548258 | 5/1977 | Germany | 29/852 |
| 3-129795 | 6/1991 | Japan | 29/829 |
| 5-152754 | 6/1993 | Japan | 29/829 |

*Primary Examiner*—Carl J. Arbes
*Attorney, Agent, or Firm*—Scully, Scott, Murphy & Presser

[57] ABSTRACT

A method for fabricating a multilayer printed circuit board, as well as the resulting multilayer printed circuit board, is disclosed. The multilayer printed circuit board includes a substrate, a first conductive circuit layer, a photosensitive dielectric layer and a second conductive circuit layer which is electrically connected to the first conductive circuit layer through photo-via holes formed in the photosensitive dielectric layer. The second conductive circuit layer includes a wiring area where a plurality of wires are arranged and a pad area to which an external wire is to be connected using thermocompression bonding. Significantly, to avoid depressing the photosensitive dielectric layer underneath the pad area during the thermocompression bonding, the thickness of the second conductive circuit layer at least in the pad area, is made greater than that in the wiring area by extending this thickness into the photosensitive dielectric layer.

2 Claims, 5 Drawing Sheets

METHOD OF FABRICATING MULTILAYER PRINTED CIRCUIT BOARD

CROSS-REFERENCE TO RELATED APPLICATIONS

This application is a divisional application of Ser. No. 08/761,027; filed on Dec. 5, 1996.

BACKGROUND OF THE INVENTION

1. Field of the Invention

The present invention relates to a multilayer printed circuit board and to a method of fabricating the multilayer printed circuit board. More particularly, the present invention relates to a multilayer printed circuit board where a plurality of wires in different wiring layers are electrically connected by via-holes and to a method of fabricating this multilayer printed circuit board.

2. Background of the Invention

As electronic equipment becomes smaller and more compact, the printed circuit board on which such electronic equipment is mounted must have a larger number of wires in a limited space. This requirement can be achieved by increasing the number of circuit layers (also called wiring layers herein) of the printed circuit board and making the board into a multilayer circuit board. A plurality of such circuit layers are then connected to each other through via holes.

A now conventional process for fabricating a multilayer printed circuit board is described with reference to FIG. 1. As shown in FIG. 1, a layer of electrically conductive material 11 is first formed on an electrically insulating substrate 10 (FIG. 1(a)). Then, a layer of photoresist 12 is blanket-coated onto the electrically conductive layer 11 and is selectively exposed to actinic radiation and developed (FIG. 1(b)). The electrically conductive layer 11 is selectively etched using the patterned photoresist layer 12 as an etch mask to form a desired lower wiring layer 13 (FIG. 1(c)) and then the patterned photoresist layer 12 is stripped (FIG. 1(d)). Next, a photosensitive dielectric layer 14 is formed on the lower wiring layer 13 (FIG. 1(e)). This dielectric layer 14 is selectively exposed to actinic radiation and then developed to form one or more photo-via holes 15, thereby uncovering selected areas of the lower wiring 13 (FIG. 1(f)). Thereafter, using any of a variety of metal deposition techniques such as electroless plating or sputtering, an upper wiring layer 16 is formed on the dielectric layer 14 and metal is deposited onto the sidewalls and bottoms of the photo-via holes 15 (FIG. 1(g)). By repeatedly performing these steps, a plurality of electrically connected wiring layers is readily formed.

A multilayer printed circuit board formed as described above is connected to an external circuit through a metal wire such as a gold wire. This is achieved by bonding the gold wire to the board. FIG. 2 is a diagram showing a gold wire bonded to the printed circuit board. As shown in FIG. 2(a), a wire 16 has been conventionally connected to a predetermined connection area on an upper wiring layer 15 formed on a photosensitive dielectric layer 14. In normal wire bonding, the wire 16 is pressed against the connection area using a force of about 50 g to 150 g, while ultrasonic vibration is applied to the connection area so that the gold wire is fixed to the connection area by thermocompression bonding.

One type of photosensitive dielectric material is, for example, epoxy resin having photosensitivity. One such photosensitive epoxy resin is sold (in what is initially liquid form) under the trade name PROBIMER-52 by Ciba Geigy of Japan. Although there are other such materials, this photosensitive resin is susceptible to deformation by high temperature or high pressure. Therefore, when bonding the wire 16 to the bonding pad 15 overlying the photosensitive resin layer 14, there are some cases where the photosensitive resin layer 14 is softened by thermocompression bonding through application of heat and application of pressure and therefore a depressed portion occurs in the direction where the wire 16 is pressed, as shown by reference character A in FIG. 2(a). In addition to the softening caused by heat or pressure, there is the possibility that the size of the depressed portion will be increased by the ultrasonic vibration applied to the bonding pad 15, when bonding is performed.

If wire bonding is performed under the above-described circumstances, there is the possibility that, at the portion B clamped by the capillary head 17 of a bonding machine at the edge of the depressed portion A, the wire 16 will be excessively locally stressed and cut, as shown in FIG. 2(b). On the other hand, if the temperature, applied when bonding is performed, is set to a low temperature in order to prevent the formation of such a depressed portion of the photosensitive resin layer 14, then there will be the problem that a sufficient connection strength cannot be obtained between the wire and the pad and therefore a reduction in reliability of the connection will be caused.

SUMMARY OF THE INVENTION

Accordingly, an object of the present invention is to prevent a photosensitive resin layer from being depressed by external heat, pressure, or ultrasonic vibration.

Another object of the present invention is to perform wire bonding without reducing the strength of the connection between the wire and the pad.

To achieve the above objects and in accordance with one aspect of the present invention, there is provided a multilayer printed circuit board having a substrate, a first conductive circuit layer formed on the substrate, a photosensitive dielectric layer formed on the first conductive circuit layer, and a second conductive circuit layer formed on the photosensitive dielectric layer and electrically connected to the first conductive circuit layer through a plurality of photo-via holes formed in the photosensitive dielectric layer. In the multilayer circuit board, the second conductive circuit layer has a wiring area where a plurality of wires are arranged and a pad area to which external heat or pressure is to be applied in order to connect a conductive wire. Significantly, the thickness of the second conductive circuit layer in at least part of the pad area is greater than that of the second conductive circuit layer in the wiring area because, at least in this part of the pad area, the second conductive circuit layer extends into the photosensitive dielectric layer.

In accordance with another aspect of the present invention, there is provided a multilayer circuit board having a substrate, a first conductive circuit layer formed on the substrate, a photosensitive dielectric layer formed on the first conductive circuit layer, and a second conductive circuit layer formed on the photosensitive dielectric layer which is electrically connected to the first conductive circuit layer through a plurality of photo-via holes formed in the photosensitive dielectric layer. In the multilayer circuit board, the second conductive circuit layer has a wiring area where a plurality of wires are arranged and a pad area to which external heat or pressure is to be applied in order to connect a conductive wire. Significantly, the thickness of the photosensitive dielectric layer existing under at least part of the pad area is less than that of the photosensitive dielectric layer existing under the wiring area, excluding the photo-via holes, because the former thickness is reduced by the degree to which the second conductive layer extends into the photosensitive dielectric layer.

In accordance with still another aspect of the present invention, there is provided a method of fabricating a multilayer printed circuit board, comprising the steps of forming a first conductive circuit layer having a predetermined wiring pattern on a substrate; forming a photosensitive dielectric layer on the first conductive circuit layer; selectively exposing and developing the photosensitive dielectric layer so that in a contact-hole area a first photo-via hole is formed having a depth which extends to the first conductive circuit layer, and in at least part of a pad area, a second photo-via hole is formed having a depth which does not extend to the first conductive circuit layer; in at least the contact-hole area and the pad area, selectively forming a second conductive circuit layer; and bonding a conductive wire to the second conductive circuit layer in the pad area.

As a consequence of the foregoing, in the area where the bonding pad is formed, the thickness of the photosensitive dielectric layer is reduced by the depth of the second photo-via hole. When this second photo-via hole is metallized in conjunction with the formation of the second conductive circuit layer, the presence of this metal extending into the photosensitive dielectric layer reduces susceptibility to softening. Therefore, an occurrence of depression due to softening is reduced.

BRIEF DESCRIPTION OF THE DRAWINGS

The invention is described with reference to the accompanying drawings wherein.

DETAILED DESCRIPTION OF THE PREFERRED EMBODIMENT(S)

Figure 1A:
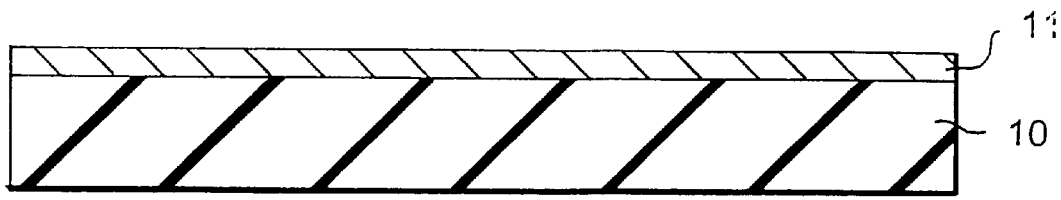
FIG. 1 depicts the now conventional steps involved in fabricating a multilayer printed circuit board which includes a photosensitive dielectric layer.
Figure 1B:
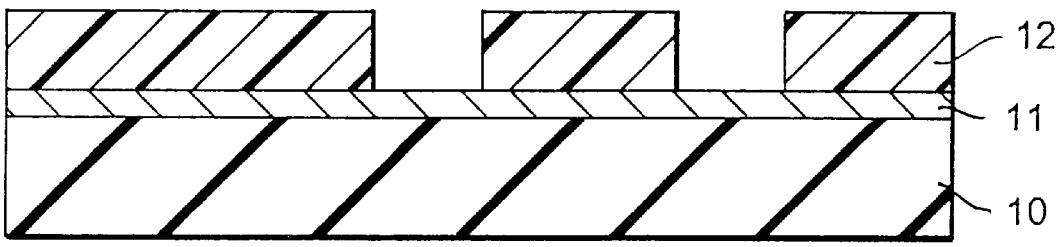
Figure 1C:
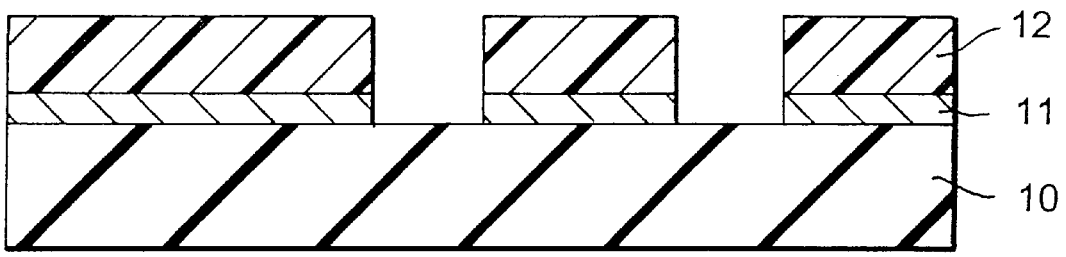
Figure 1D:
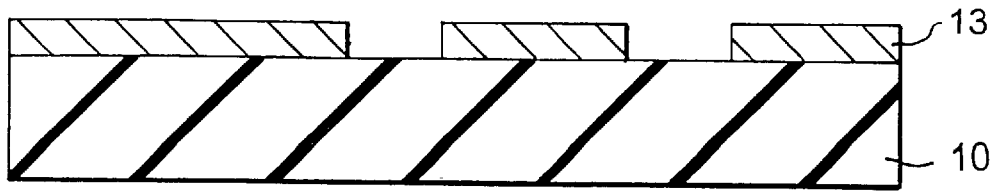
Figure 1E:
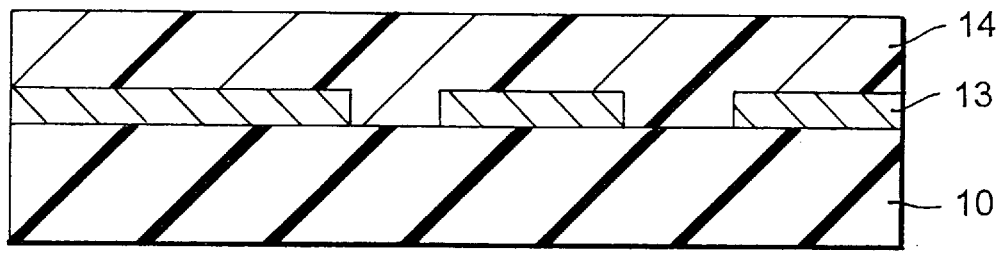
Figure 1F:
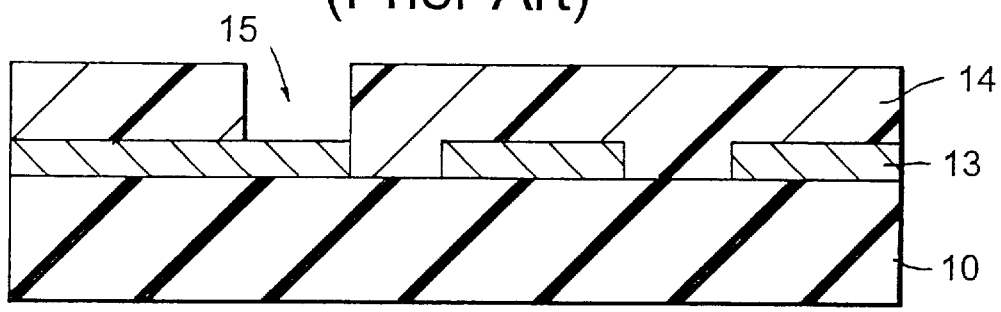
Figure 1G:
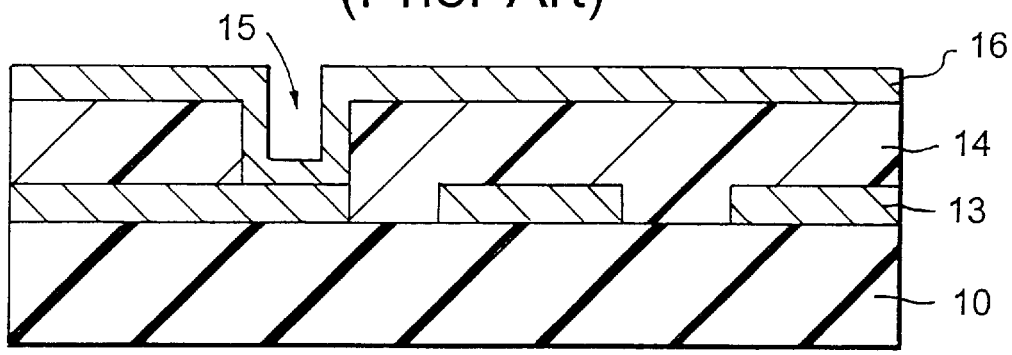
Figure 2A:
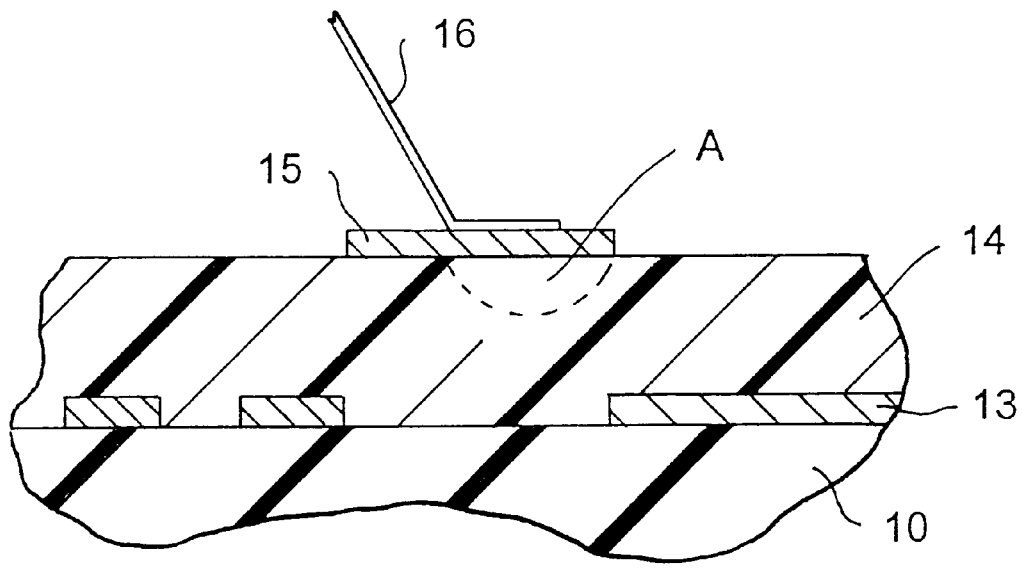
FIG. 2 depicts a gold wire bonded to a now conventional multilayer printed circuit board.
Figure 2B:
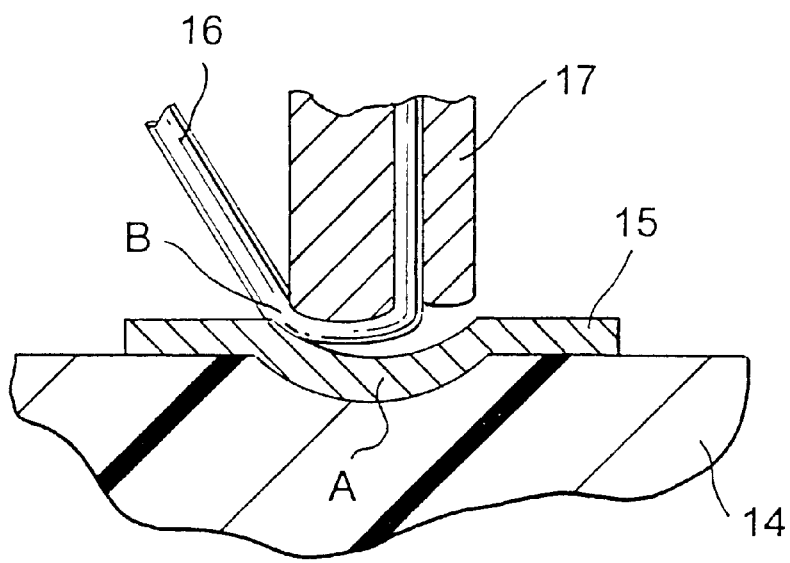

A preferred embodiment of the inventive method for fabricating a multilayer printed circuit board is described hereinbelow with reference to FIG. 3, with the resulting multilayer printed circuit board being depicted in FIG. 4. As shown in FIG. 3, in the first step of the inventive fabrication method, a blanket metal layer 32 of copper is formed on an organic substrate 31. This is achieved by using either a deposition method, such as sputtering, or an electroless plating method (FIG. 3(a)). This metal layer 32 is then patterned into a wiring layer (FIG. 3(b)). This is performed by forming a patterned photoresist on the metal layer 32, and then etching the metal layer 32 while using the patterned photoresist as an etch mask. After the etching step, the photoresist is stripped.

A dielectric layer 33 made of photosensitive resin is formed on the metal layer 32. Then, the photosensitive dielectric layer 33 is selectively exposed to actinic radiation and developed so that, at an area 35, a photo-via hole 34 is formed in the photosensitive dielectric layer 33. The hole 34 has a depth which extends to the lower circuit layer 32, thus uncovering a corresponding portion of the lower circuit layer 32. Also, a photo-via hole 37 is formed in the photosensitive dielectric layer 33 at an area 36. Significantly, the hole 37 has a depth which does not extend to the lower circuit layer 32, and thus the corresponding portion of the lower circuit layer 32 remains covered (FIG. 3(c)). The area 35 is an area for forming a contact hole through which the lower circuit layer 32 is to be electrically connected to an upper circuit layer 38, to be formed in a subsequent step. The area 37 is an area for forming a connection pad, to be formed in a subsequent step, to which a wire is to be connected. The holes 34 and 37 may either be formed in two steps or at the same time in a single step. In the case where the holes are formed in two steps, either hole is first formed with a first set of predetermined exposure conditions and a predetermined mask and then the other hole is formed using a second set of exposure conditions and the same mask. In the case where the holes are formed at the same time in a single step, the diameter of the deeper hole 37 is formed so as to be larger than that of the shallower hole 34. Because the diameter and the depth of each hole would be in proportion to each other even if the exposure conditions were the same, the depth of each hole can be controlled by varying the size of the hole diameter. Thus, it is possible to form holes differing in depth in the same step.

Figure 3A:
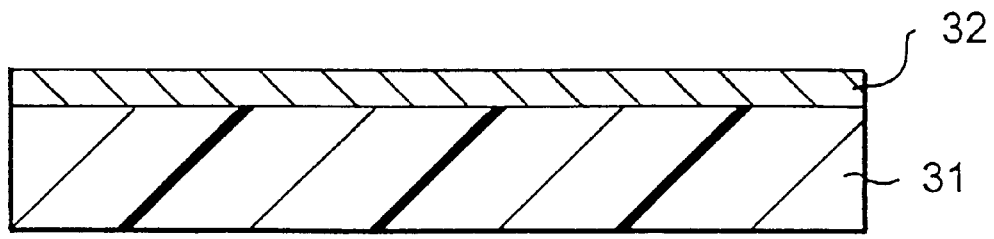
FIG. 3 depicts the steps involved in fabricating a multilayer printed circuit board in accordance with a preferred embodiment of the inventive fabrication method.
Figure 3B:
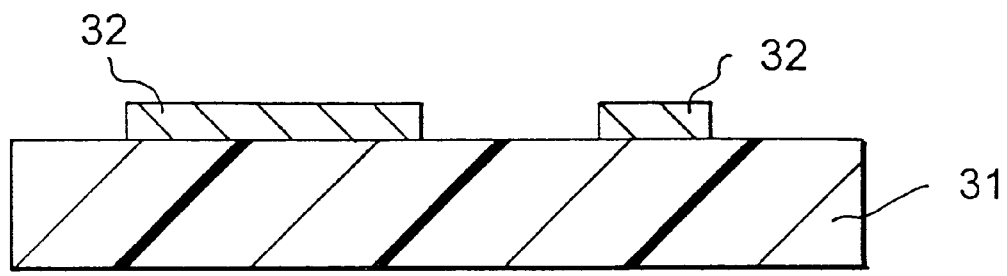
Figure 3C:
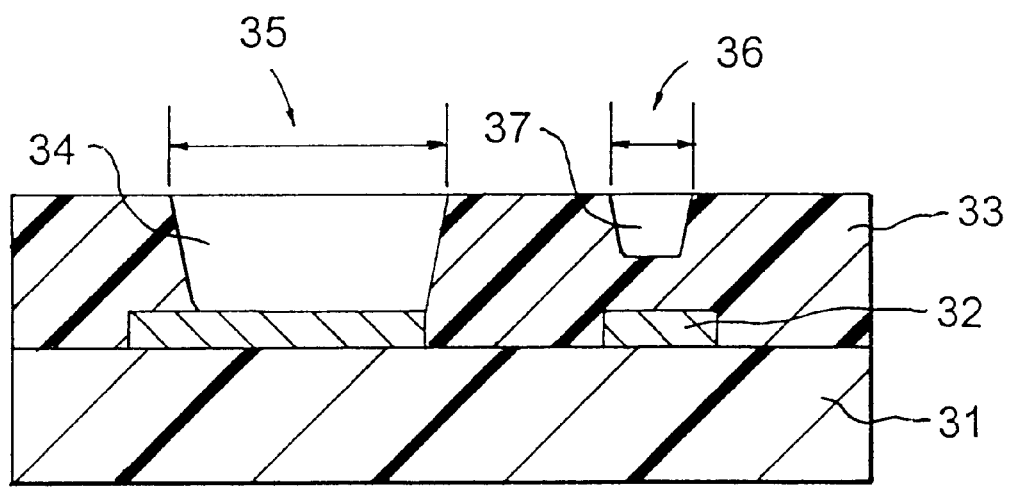
Figure 3D:
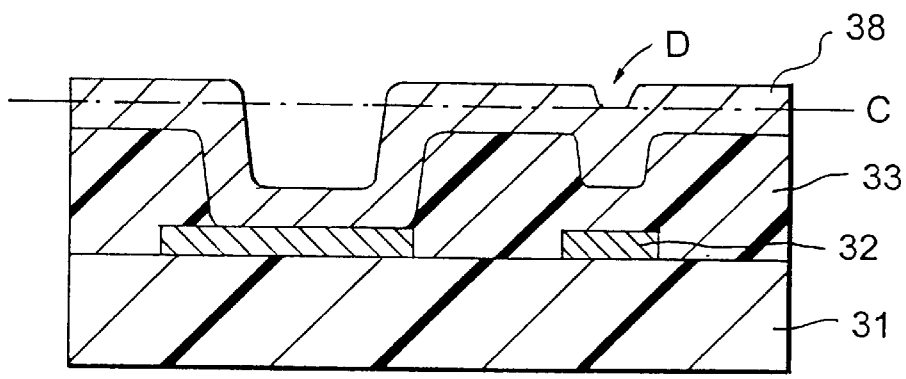

As shown in FIG. 3(d), a metal layer 38 is next deposited onto the surface of the exposed and developed photosensitive dielectric layer 33. This metal layer is to be patterned to form an upper circuit layer 38. This metal layer 38, like the metal layer 32, is readily formed using a film formation method such as a plating method. Thereafter, the surface of the metal layer 38 is sufficiently planarized (i.e., etched back) so that the height of the upper surface of the circuit layer 38 is reduced to the leveling position C (FIG. 3(d)). If the height of the upper surface of the metal layer 38 is not reduced to the leveling position C in this step, a depressed portion D will remain even if the surface of the circuit layer were removed in the step of forming a connection pad and, consequently, the possibility may occur that a flat connection pad cannot be obtained. If the depressed portion D remains in this way, then the connection strength of a wire bonded to the connection pad will be undesirably low. Therefore, in order to prevent an occurrence of a depressed portion D such as this, it is necessary that the hole 37 be plated so as to be completely filled up. Then, a planarization step, i.e., an etch back step, is carried out on the metal layer 38 in order to get rid of the depressed portion D and make the surface of the connection pad 40 substantially flat and planar.

Figure 3E:
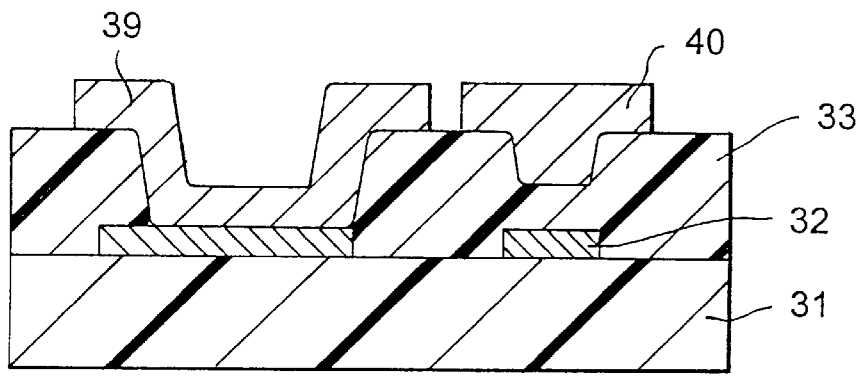

The metal layer 38 is now patterned to form upper circuit layer 38 (FIG. 3(e)). As a result, a metallized contact hole 39 is formed in the area 34. Also, the connection pad 40 is formed in the area 36. Furthermore, wiring areas (not shown) are formed. Finally, the multilayer circuit board is completed by bonding a gold wire to the connection pad 40.

Figure 4:
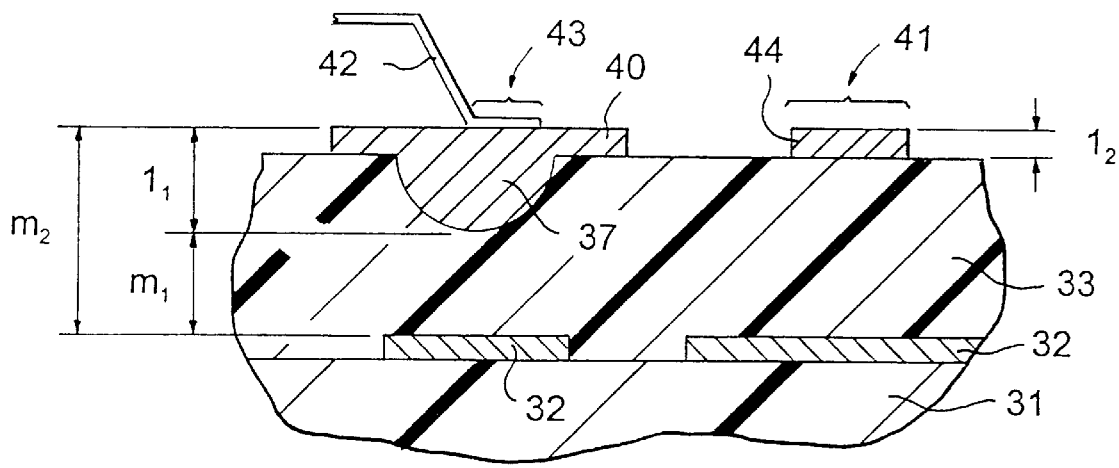
FIG. 4 is an enlarged sectional view of a preferred embodiment of the inventive multilayer printed circuit board.

FIG. 4 is an enlarged sectional view showing the area 37 of the multilayer circuit board formed as described above. The metal layer 32, patterned into a wiring layer, has been formed on the organic substrate 31. Also, the dielectric layer 33 composed of the photosensitive organic resin has been formed on the metal layer 32. In the area 37, the connection pad 40, having a substantially flat and planar surface, has been formed on the photosensitive dielectric layer 33. The connection pad 40 has been formed on the hole 37 by the aforementioned method. Therefore, the thickness of the connection pad 40 in the area 43 where a gold wire 42 has been connected, that is, the thickness $l_1$, is greater than the thickness $l_2$ of the circuit layer in the wiring area 41 where a wire 44 has been formed. Stated alternatively, at least in the area where the connection pad 40 has been formed, the thickness $m_1$ of the photosensitive dielectric layer 33 existing under the area 43 to which external heat and pressure are applied is less than the thickness $m_2$ of the photosensitive dielectric insulation layer 33 existing under the wiring area 41.

With the configuration described above, at the area where the pad 40 is formed, the material of the circuit layer 38 existing in the hole 37, as compared with the material of the photosensitive dielectric layer, is a material which is not easily deformed by heat and also has a strong resistance to the pressure and ultrasonic vibration at the time of bonding. Therefore, even in a case where a wire is bonded to the area 43, the area 43 is not easily depressed. In addition, the metal of the circuit layer 38 in the hole 37 makes contact with the photosensitive dielectric layer over a curved surface and the surface area of the contacted portion is large. Therefore, because the force applied to the area 43 is distributed, the force on the insulation layer per unit area (i.e., the stress) is reduced and thus the dielectric layer of this contacted portion becomes less susceptible to deformation.

While a circuit board having two circuit layers has been described in the aforementioned preferred embodiment, it is obvious that the present invention is applicable to a board having three or more circuit layers. If the organic substrate 31 shown in FIGS. 3 and 4 is considered to be a photosensitive dielectric layer having the same material as the dielectric layer 33 and it is assumed that an organic substrate exists under the dielectric layer, then the description of FIGS. 3 and 4 will hold true of a circuit board having three or more circuit layers. Note that the circuit board may be constructed such that, under at least the area 43 which is part of the area where the bonding pad 40 is formed, a lower metal layer 32 exists under the dielectric layer 33. In a case where the organic substrate 31 is replaced with a photosensitive dielectric layer, that is, in a structure having three or more circuit layers, a metal layer 32 such as this exists under the connection pad. This metal layer can effectively prevent the heat, pressure, or vibration applied to the connection pad from being transmitted to the dielectric layer existing under the metal layer 32. Therefore, the deformation of the dielectric layer existing under this metal layer 32 can be suppressed.

Furthermore, while it has been described in the aforementioned embodiment that the hole 37 is filled up with the upper circuit layer itself, the hole may be filled up with an additional material having a strong resistance to heat and the connection pad may be formed on this material. In addition, the hole 37, as with the hole 34, can be formed so that it has a depth which extends to the lower circuit layer 32, and therefore $m_1=0$. Even in this case, an occurrence of depression can be effectively prevented, but attention must be paid so that the lower circuit layers 32 are not connected with each other and the occurrence of a dead space can be maximally suppressed.

While, in the aforementioned embodiment, the bonding pad to which a bonding wire is connected has been shown as an example of an area to which external heat or pressure is applied, the present invention is not limited to this area but is widely applicable to an area where external heat or pressure is applied. The pad area in the present invention is used in a broad sense including such an area.

Thus, in the present invention, the depression of the photosensitive dielectric insulation layer is effectively prevented and it becomes possible to easily perform bonding without reducing the strength of the connection between the wire and the pad.

What is claimed is:

1. A method of fabricating a multilayer circuit board, comprising the steps of:

forming a first conductive circuit layer including a wiring pattern on a substrate;

forming a photosensitive dielectric layer on said first conductive circuit layer;

forming a first photo-via hole in said photosensitive dielectric layer having a depth which extends to said first conductive circuit layer;

forming a second photo-via hole in said photosensitive dielectric layer, said second photo-via hole having a depth which does not extend to said first conductive circuit layer;

depositing electrically conductive material into said first and second photo-via holes; and electrically connecting a conductive wire to the electrically conductive material in said second photo-via hole.

2. The method of fabricating a multilayer circuit board as set forth in claim 1, further comprising the step of substantially planarizing a surface of the electrically conductive material which extends out of said second photo-via hole.

* * * * *